United States Patent
Wheaton et al.

(10) Patent No.: US 9,709,653 B2
(45) Date of Patent: Jul. 18, 2017

(54) MAPPING EDDY CURRENT FIELDS IN MRI SYSTEM

(71) Applicant: TOSHIBA MEDICAL SYSTEMS CORPORATION, Otawara-shi (JP)

(72) Inventors: Andrew J. Wheaton, Shaker Heights, OH (US); Wayne R. Dannels, Mentor, OH (US)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 1187 days.

(21) Appl. No.: 13/770,963

(22) Filed: Feb. 19, 2013

(65) Prior Publication Data
US 2014/0232393 A1   Aug. 21, 2014

(51) Int. Cl.
*G01R 33/565* (2006.01)
*G01R 33/24* (2006.01)
*G01R 33/561* (2006.01)

(52) U.S. Cl.
CPC ....... *G01R 33/56518* (2013.01); *G01R 33/24* (2013.01); *G01R 33/5617* (2013.01)

(58) Field of Classification Search
CPC .... G01R 33/243; G01R 33/24; G01R 33/389; G01R 33/56518
See application file for complete search history.

(56) References Cited

U.S. PATENT DOCUMENTS

| | | | |
|---|---|---|---|
| 4,698,591 A | 10/1987 | Grover et al. | |
| 4,928,063 A | 5/1990 | Lampman et al. | |
| 5,864,233 A | 1/1999 | Zhou et al. | |
| 6,025,715 A | 2/2000 | King et al. | |
| 6,191,582 B1 | 2/2001 | Zur | |
| 6,211,675 B1 | 4/2001 | Ganin et al. | |
| 6,448,773 B1 | 9/2002 | Zhang | |
| 6,836,113 B2 | 12/2004 | Zhang | |
| 6,989,672 B2 | 1/2006 | Zhang | |
| 7,323,872 B1 | 1/2008 | Takahashi et al. | |
| 8,077,955 B2 | 12/2011 | Dannels et al. | |
| 8,248,070 B1* | 8/2012 | Wheaton ............ | G01R 33/4828 324/307 |

(Continued)

OTHER PUBLICATIONS

Axel, et al., "MR Imaging of Motion with Spatial Modulation of Magnetization," *Radiology*, vol. 171, pp. 841-845 (1989).

(Continued)

*Primary Examiner* — Melissa Koval
*Assistant Examiner* — Rishi Patel
(74) *Attorney, Agent, or Firm* — Nixon & Vanderhye P.C.

(57) ABSTRACT

Eddy current fields in a magnetic resonance imaging (MRI) system are mapped by acquiring MRI data from an object located in an imaging volume of the MRI system. An MRI data acquisition sequence is preceded by a pre-sequence including (a) a gradient magnetic field transition that stimulates eddy current fields in the MRI system, and (b) a spatial modulation grid tag module that sensitizes a spatially resolved MR image of the acquired MRI data to the stimulated eddy current fields that existed during the spatial modulation grid tag module. The eddy-sensitized MR image is processed to calculate a spatially resolved map of fields produced by the eddy currents.

20 Claims, 8 Drawing Sheets

(56) References Cited

U.S. PATENT DOCUMENTS

2010/0239151 A1 9/2010 Dannels et al.

OTHER PUBLICATIONS

Axel, et al., "Heart Wall Motion: Improved Method of Spatial Modulation of Magnetization for MR Imaging," *Radiology*, vol. 172, pp. 349-350 (1989).

Bodammer, et al., "Eddy Current Correction in Diffusion-Weighted Imaging Using Pairs of Images Acquired With Opposite Diffusion Gradient Polarity," *Magnetic Resonance in Medicine*, vol. 51, pp. 188-193 (2004).

Boesch, et al., "Temporal and Spatial Analysis of Fields Generated by Eddy Currents in Superconducting Magnets: Optimization of Corrections and Quantitative Characterization of Magnet/Gradient Systems," *Magnetic Resonance in Medicine*, vol. 20, pp. 268-284 (1991).

Calamante, et al., "Correction for Eddy Current Induced $B_0$ Shifts in Diffusion-Weighted Echo-Planar Imaging," *Magnetic Resonance in Medicine*, vol. 41, pp. 95-102 (1999).

Grieve, et al., "Elimination of Nyquist Ghosting Caused by Read-Out to Phase-Encode Gradient Cross-Terms in EPI," *Magnetic Resonance in Medicine*, vol. 47, pp. 337-343 (1991).

Haselgrove, et al., "Correction for Distortion of Echo-Planar Image Used to Calculate the Apparent Diffusion Coefficient," *Magnetic Resonance in Medicine*, vol. 36, pp. 960-964 (1996).

Jezzard, et al., "Characterization of and Correction for Eddy Current Artifacts in Echo Planar Diffusion Imaging," *Magnetic Resonance in Medicine*, vol. 39, pp. 801-812 (1998).

Liu, et al., "Quantitative Characterization of the Eddy Current Fields in a 40-cm Bore Superconducting Magnet," *Magnetic Resonance in Medicine*, vol. 31, pp. 73-76 (1994).

Osman, et al., "Cardiac Motion Tracking Using CINE Harmonic Phase (HARP) Magnetic Resonance Imaging," *Magnetic Resonance in Medicine*, vol. 42, pp. 1048-1060 (1999).

Papadakis, et al., "Gradient Preemphasis Calibration in Diffusion-Weighted Echo-Planar Imaging," *Magnetic Resonance in Medicine*, vol. 44, pp. 616-624 (2000).

Papadakis, et al., "k-Space Correction of Eddy-Current-Induced Distortions in Diffusion-Weighted Echo-Planar Imaging," *Magnetic Resonance in Medicine*, vol. 53, pp. 1103-1111 (1991).

Rohde, et al., "Comprehensive Approach for Correction of Motion and Distortion in Diffusion-Weighted MRI," *Magnetic Resonance in Medicine*, vol. 51, pp. 103-114 (2004).

Shen, et al., "Correction of High-Order Eddy Current Induced Geometric Distortion in Diffusion-Weighted Echo-Planar Images," *Magnetic Resonance in Medicine*, vol. 52, pp. 1184-1189 (1991).

Wysong, et al., "A Simple Method of Measuring Gradient Induced Eddy Currents to Set Compensation Networks," *Eddy Current Measuring Technique*, pp. 119-121 (1993).

Xu, et al., "Correcting High Order Eddy Current Induced Distortion for Diffusion Weighted Echo Planar Imaging," *ISMRM*, vol. 19, p. 4564 (2011).

Xu, et al., "Correcting High Order Eddy Currents for Diffusion Weighted Imaging with Arbitrary Scan Plane and Diffusion Direction," *ISMRM*, vol. 20, p. 4163 (2012).

\* cited by examiner

MAPPING EDDY CURRENT FIELDS IN MRI SYSTEM

FIELD

The subject matter below relates generally to magnetic resonance imaging (MRI) process and apparatus for mapping eddy current fields caused by pulsed magnetic gradient fields in an MRI system. Such maps can be used for compensating/correcting errors in diagnostic MR images caused by such eddy currents.

DETAILED DESCRIPTION

Figure 1:
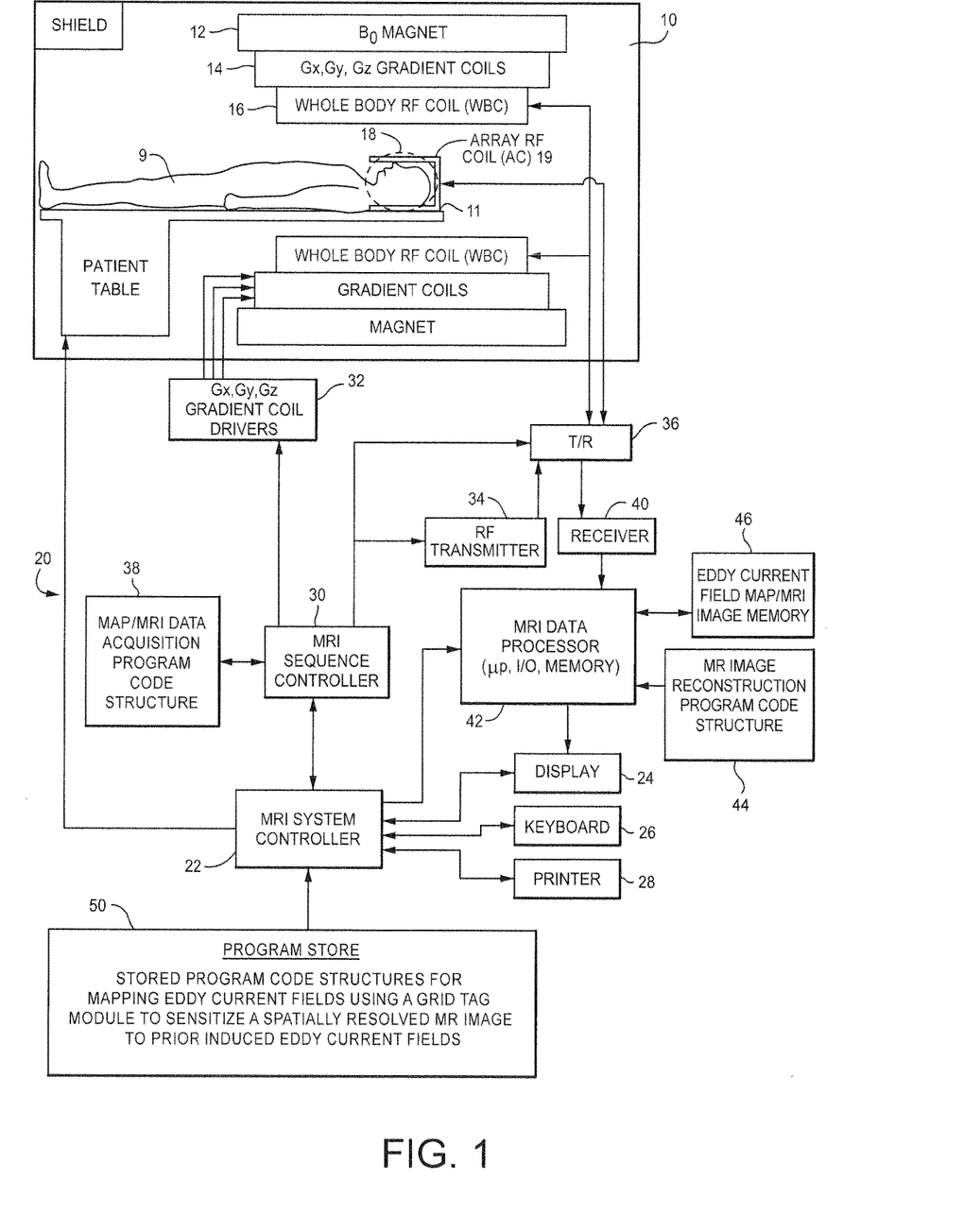
FIG. 1 is a high-level schematic block diagram of an MRI system adapted to acquire a map of eddy current fields using a grid tag module to sensitize a spatially resolved MR image to previously induced eddy current fields.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 might be more closely coupled to the patient head in image volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC).

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing eddy current map data acquisition sequences which can later be employed in conjunction with other (e.g., conventional diagnostic) MRI sequences already available in the repertoire of the MRI sequence controller 30—to correct/compensate for eddy current effects.

The MRI system 20 includes an RF receiver 40 providing input to data processor 42 so as to create processed image data, which is sent to display 24. The MRI data processor 42 is also configured for access to previously acquired eddy current map data 46 and to correction/compensation MR image data such as program code structure 50, as well as MRI image reconstruction program code structure 44.

Also illustrated in FIG. 1 is a generalized depiction of an MRI system program store 50 where stored program code structures (e.g., for mapping eddy current fields using a grid tag module to sensitize a spatially resolved MR image to previously induced eddy current fields, for correcting image reconstruction using eddy current field maps, for defining graphical user interfaces and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an eddy current-corrected imaging reconstruction process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaged volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide improved ways to process data acquisitions and/or to generate and display MR images.

Changing magnetic gradient fields cause, in accordance with Lenz's law, an unwanted opposing magnetic field (eddy current). This is generally modeled as an exponential decaying function proportional to a change in amplitude of the gradient field ($\Delta G$). Eddy currents are typically modeled using spherical harmonic polynomials where there are: a zeroeth order term (spatially invariant field); first order terms (linear field gradients), including "self-terms": X-on-X ($\Delta G_X$ causes gradient in X direction), Y-on-Y and "cross-terms": X-on-Y, ($\Delta G_X$ causes gradient in Y direction), Y-on-X; and higher order terms.

Eddy currents are often affected by small MRI system details such as gradient tube manufacturing imperfections, gradient tube installation imperfections, cryostat design, cryogen (helium) levels, shield design and the like.

Eddy current fields can affect MR image quality in various ways. EPI (echo planar imaging) distortion can occur where diffusion-weighting MPG (motion probing gradients) produce large eddy currents, where distortion amplitude and direction(s) are different for each b vector, and/or where misalignment of images caused by eddy currents results in poor quality ADC and DTI maps. FSE (fast spin echo) signal loss causes mismatch in phase between spin echo and stimulated echo, resulting in echo cancellation and image signal loss.

Despite advances in magnetic gradient coil driver hardware, including gradient pre-emphasis and shielded coil designs, residual eddy current fields persist in modern commercial MR (magnetic resonance) scanners. These residual fields include zeroeth (B0), linear (X, Y, Z) and higher order spatial terms ($Z^2$, XY, $X^2$, $Y^2$, etc.). For most applications, residual eddy fields have a negligible effect on image quality. However, some sequence applications like Diffusion Weighted Echo Planar Imaging (DW-EPI) are sensitive to these eddy fields.

Methods exist to compensate DW-EPI either in reconstruction or by fine adjustment of gradient moments, frequency offsets and receiver phase. However, these compensation methods address only zeroeth and/or linear eddy terms. Recent studies have emphasized the effects on DW-EPI of the remaining uncompensated higher order eddy terms and demonstrated methods for their correction.

Eddy current correction may be attempted with the use of more than one countermeasure, or with one more than one iteration of adjustment of a single eddy current countermeasure. Thus, after some number of corrections, it can be practical to measure the residual or remnant eddy current effects which were not exactly corrected. Alternatively, it may be desirable in some cases to turn off or zero previously set correction methods, to allow a more direct determination of the original characteristics of the eddy currents before some level of correction.

To correct linear and/or higher order remnant eddy fields, a measurement or model of the spatial distribution of the remnant eddy fields is necessary. Existing methods of volumetric field mapping typically acquire only one phase encode per TR, which can be slow if TR is long.

We have now developed a tool to rapidly generate a 2D or 3D volumetric map of eddy current fields, including linear and higher order spatial terms.

Figure 2:
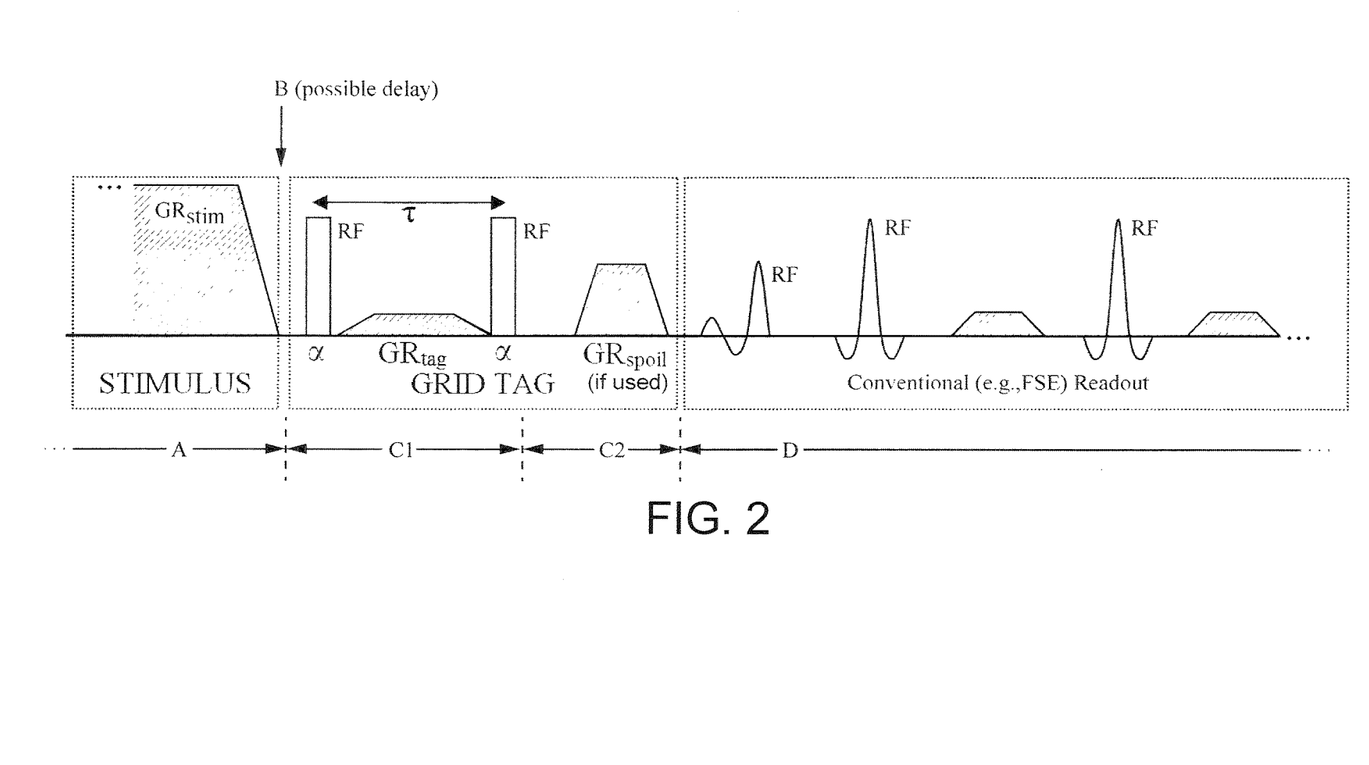
FIG. 2 is a schematic diagram of an MRI data acquisition sequence including a pre-sequence initial gradient magnetic field transition (to purposefully stimulate eddy current fields in the MRI system) and an intervening spatial modulation grid tag module that sensitizes a spatially resolved MR image of the acquired MRI data to the stimulated eddy current fields that existed during the spatial modulation grid tag module.

This exemplary eddy current mapping method utilizes a pre-pulse "grid tag" module (e.g., a pair of non-selective RF pulses separated by a gradient lobe ($GR_{tag}$), an arrangement most commonly used for grid tagging). FIG. 2 depicts an example pulse sequence diagram for eddy current mapping. An initial eddy-generating stimulus ($-\Delta GR_{stim}$) is followed by a grid tag module for sensitization by spatial modulation. The grid tag spatial modulation is then detected using a conventional MR imaging sequence (e.g., fast spin echo (FSE)).

As noted, preceding the grid tag module is an eddy current-generating stimulus ($-\Delta G$) consisting of termination ($-\Delta G$) of a simple $GR_{stim}$ gradient lobe. Any eddy current field generated by the $-\Delta G$ stimulus will result in additional MR moment accumulation during the inter-pulse period ($\tau$) of the grid tag module. This added moment will warp the imaged spatial pattern of the grid lines; the spatial warping pattern is directly related to the spatial distribution of the remnant eddy fields. The image data is read out using a conventional sequence; for efficiency, a rapid method like FSE may be used.

A grid tag module like that depicted in FIG. 2 using two RF pulses was described in Leon Axel, et al., "MR imaging of motion with spatial modulation of magnetization," *Radiology*, Vol. 171, pages 841-845 (June 1989). This was developed further to describe using more than two pulses (with binomial amplitudes, e.g., 1-3-3-1) for achieving sharper grid tag lines in Leon Axel, et al., "Heart wall motion: improved method of spatial modulation of magnetization for MR imaging," *Radiology*, Vol. 172, pages 349-350 (August 1989). Here grid tag modules were used to superimpose spatial modulation of grid lines onto imaged tissues such as moving heart tissues and the like.

The full duration of the gradient stimulus is very long, on the order of 1 second. It is long in order to allow any eddy currents induced from the initial rise to dissipate. It is desired to measure only eddies coming from the falling gradient at its trailing edge, which makes the analysis simpler. Thus, if it is known that eddy currents on a given system do not exceed some uppermost time constant, then it is advisable to set the duration of the stimulus gradient lobe to be, for example, in excess of 4 times that time constant, thereby allowing simple amplitude analyses to be accurate on the order of about 1 percent for example.

The gradient during the $\tau$ period is the spatial modulation gradient. It is very, very small relative to the stimulus gradient amplitude and it is not considered a source of eddies in the analysis. Furthermore, eddy currents generated by the spatial modulation gradient are identical in measurements both with and without the stimulus gradient, and therefore these identical eddy currents are cancelled in a subsequent processing subtraction step. The following gradients are simple readout gradients. By design, any eddy currents generated by these readout gradients have negligible effect on the eddy current measurement. The eddy current measurement is specific to the stimulus and substantially independent of the grid tag and readout parts of the measurement.

The purpose of the conventional spoiler gradient, as depicted by module "C2" in FIG. 2, is to spoil any residual transverse magnetization following the grid tag application. The grid tag modulation influences longitudinal magnetization available immediately before or at the time of the readout part of the sequence.

The significance of the optional adjustable delay time B, if desired, is to allow for time-resolved measurements. The eddy fields have a time dependence (generally modeled as exponential decaying functions). By allowing a freely adjustable B time, one can measure many time points and fit the data to an exponential model. The B time starts immediately at the end of the gradient stimulus and ends at the beginning of the first RF pulse in the grid tag module "C1".

Any of a wide variety of readout sequence techniques can be used to detect the tagged longitudinal signal. Module D in FIG. 2 represents just one such possibility. The first RF pulse in Module D may be a conventional excitation pulse, converting tagged longitudinal magnetization to detectable transverse magnetization. The last two RF peaks are refocusing pulses and part of a conventional readout sequence, which in this case is an FSE sequence.

The non-selective grid tag RF pulses preferably have a rectangular envelope in the time domain, but this is not required. This is all part of the conventional design of a grid tag module. Basically, there is nothing unique about the design of the grid tag module, per se. The amplitude of the RF pulses (area inside the rectangle—proportional to flip angle) is designed to provide signal saturation that generates a grid tagging pattern. If the combined flip angle is too weak (e.g., <30° flip), the resultant saturation will be weak and the measurement sensitivity will suffer. If the combined flip angle is too strong (e.g., >90° flip), the saturation will also be decreased. For combined flip angles >90°, the magnetization will nutate past the transverse plane resulting in nonzero longitudinal magnetization remaining after the completion of the grid tag module thus appearing as bright signal in the image. As an extreme example, if the combined flip angle were 180°, assuming insignificant T1 relaxation, the spins would simply invert their longitudinal magnetization resulting in no grid tagging at all in the image.

While choices of more complicated tagging RF pulses, including higher binomial coefficients is commonplace for applications such as cardiac motion analysis, the simpler 1-1 tag pulse scheme offers an advantage with the subsequent k-space based processing of one embodiment of this method. In particular, sinusoidal modulation generates fewer sidelobes or "replicants" in k-space, and converts more of the signal energy into those sidelobes. More signal in fewer sidelobes, and subsequent better separation of those sidelobes converts in to better SNR and better spatial resolution associated with each sidelobe, and hence more robust analysis of the tagging modulation.

Generally, the RF pulses of the grid tag are kept short in order to save time and make the precision of the B end period more precise. RF pulse durations ranging from 200 μs to 1 ms are preferable, but other times could be used. Shorter pulse duration carries the additional advantage of wider pulse bandwidth, and more consistent tagging quality in the presence of off-resonance. These design parameters and considerations are common for any conventional grid tagging design.

The exemplary grid tag module pulse sequence design is well understood. It is, however, new to use the grid tag for sensitization to eddy currents. One can design the grid tag module by adjusting the τ spacing and/or modulation gradient amplitude to make the mapping method more or less sensitive to different sources or characteristics of eddy currents.

Figure 3:
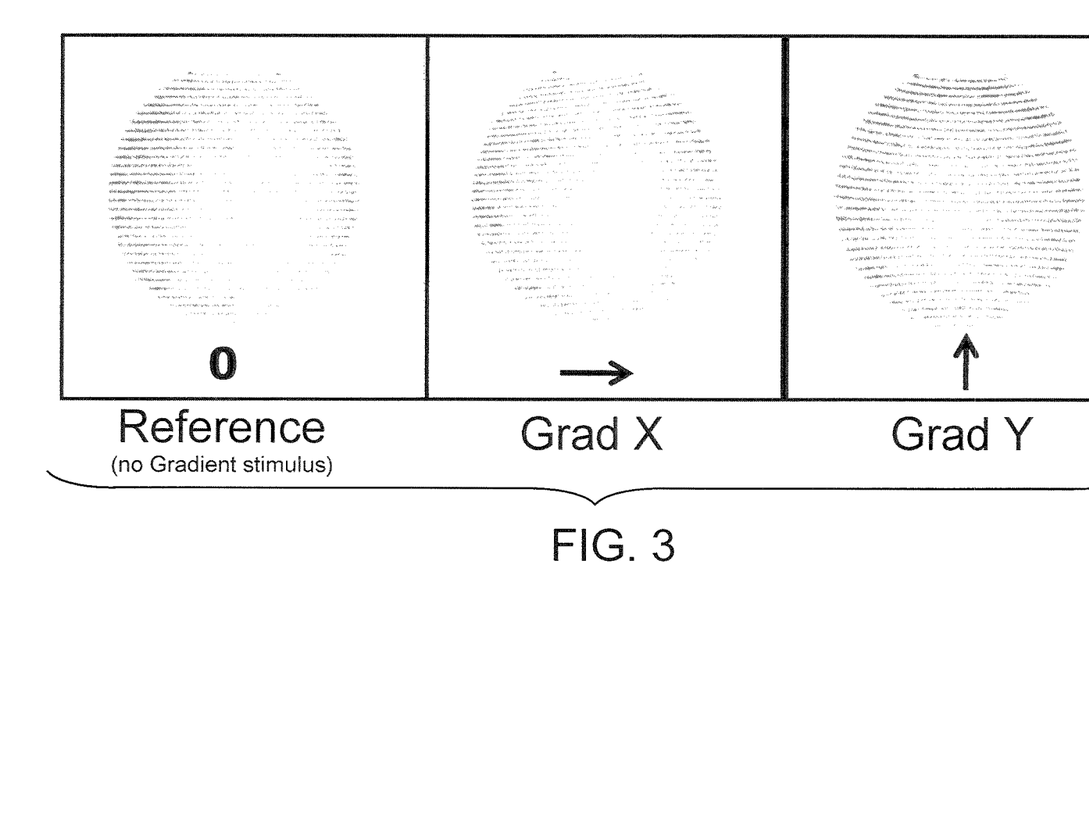
FIG. 3 depicts reconstructed magnitude spatial domain images of MRI data acquired by the FIG. 2 sequence for a reference image (no applied ΔG stimulus), an image where eddy fields have been stimulated in the X direction (using a ΔGx stimulus) and another where the eddy fields have been stimulated in the Y direction (using a ΔGy stimulus).

The effect of the eddy-generated moment is to spatially warp the grid tag lines (e.g., see Grad X stimulus and Grad Y stimulus spatial domain images in FIG. 3). (A shorthand notation like XeY is introduced for spatially linear eddy current components, where the letter before the "e" denotes the stimulus gradient, and the letter after the "e" denotes the spatial direction of a resulting eddy current spatially linear field component.) An eddy component in the same direction as the grid tag gradient $GR_{tag}$ (self-terms, e.g., YeY) results in a dilation or compression of the grid tag lines. An eddy component in the orthogonal direction (cross-terms, e.g., YeX) generates a rotation of the grid tag lines. The dilation/compression and/or rotation occur locally depending on the local spatial distribution of the eddy terms.

The spatial warping can be measured in the conventional magnitude spatial domain images using conventional image processing methods. That is, the magnitude image pixel data of FIG. 3 can be used directly as input to eddy current compensation processes.

However, our current preference for simplicity and robustness is to process the warping in k-space (resulting in phase maps and ultimately eddy current field maps) using methods similar to those described in U.S. Pat. No. 8,077,955 and/or Published Application No, US 2010/0239151 A1, the entire contents of which are hereby incorporated by reference.

The sinusoidal modulation of spatial image space by the grid tag module produces spatial frequency harmonics in k-space. If the grid spacing is X cm, two new 'replicants' of k-space are produced, one at $+X^{-1}$ ('right') and one at $-X^{-1}$ ('left'), respectively, relative to the original peak of k-space ('center') nominally at K=0. These three replicants can be separated using bandpass filters (e.g., see FIG. 4) and each reconstructed by 2DFT into individual images of complex-valued pixels.

The phase image (θ) of each replicant can then be calculated using a simple arctangent using the real Re and imaginary Im parts of each complex-valued pixel:

$$\theta(x,y)=a\tan(\text{Im}(x,y)/\text{Re}(x,y)) \quad \text{[Equation 1]}.$$

An off-resonance phase map ($\theta_{off}$) is then calculated from the phase images of replicants (on a pixel-by-pixel basis) by subtraction:

$$\theta_{off}=(\theta_{right}-\theta_{left})/2 \quad \text{[Equation 2]}.$$

Notice that this calculation depends on phase difference—not absolute phase (thus automatically avoiding wrapping errors in most pixels, exclusive of perhaps a small number of boundary pixels).

A reference off-resonance phase map ($\theta_{ref}$) can be generated in the same manner as the eddy-stimulated off-resonance phase map. The purpose of the reference phase map is to measure background off-resonance phase due to non-eddy-related sources (e.g. main field shim, local field perturbations). For the reference data, the acquisition consists of zero stimulus gradient amplitude. The processing method is the same as the eddy-stimulated phase map described above.

Figure 5:
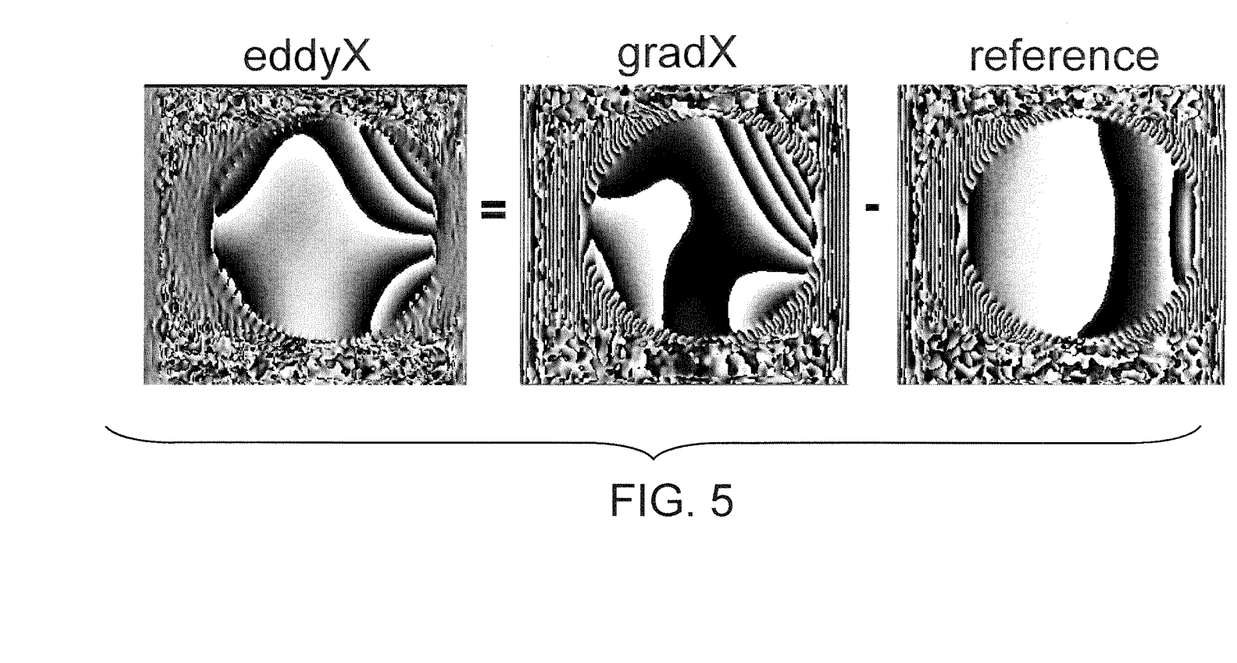
FIG. 5 depicts exemplary phase images derived from the complex-valued Fourier transformed k-space image data by subtraction of a reference phase image from the phase image associated with an X-axis eddy stimulus so as to derive a map of phase generated by stimulated eddy current fields in the X-direction.

The phase map due only to eddy-related sources ($\theta_{eddy}$) can be then calculated by subtracting the reference phase map from the off-resonance phase map (on a pixel-by-pixel basis) as depicted in FIG. 5:

$$\theta_{eddy} = \theta_{off} - \theta_{ref} \quad \text{[Equation 3]}.$$

Alternatively, an equal and opposite polarity gradient stimulus (i.e. $-GR_{stim}$) can be used to acquire the reference phase map data. In this case, the calculation of the eddy phase map ($\theta_{eddy}$) is modified.

$$\theta_{eddy} = (\theta_{off} - \theta_{ref})/2 \quad \text{[Equation 4]}.$$

Now that an eddy phase map is available, an eddy current field map may be calculated by taking a spatial derivative of an eddy current phase on a pixel-by-pixel basis:

$$XeX(x,y) = \frac{\partial \theta_{eddyX}(x,y)}{\partial x} \quad YeX(x,y) = \frac{\partial \theta_{eddyY}(x,y)}{\partial x} \quad \text{[Equation 5]}$$
$$XeY(x,y) = \frac{\partial \theta_{eddyX}(x,y)}{\partial y} \quad YeY(x,y) = \frac{\partial \theta_{eddyY}(x,y)}{\partial y}$$

For example, a simple pixel-wise derivative is represented by the discrete difference:

$$\partial \theta(x,y)/\partial x = \theta(x+1,y) - \theta(x,y)/\Delta x \quad \text{[Equation 6]}$$

(where $\Delta x$ is the pixel size).

Eddy current phase maps contain phase wraps, but when taking the spatial gradient, it is simple to avoid problems at phase wrap junctions:

Start derivative calculation at center of image
If the derivative is too large (relative to tolerance (like plus or minus $1.0\pi$)), then it must be a phase jump due to a phase wrap boundary
Remove or add $2\pi$ accordingly and continue the pixel-by-pixel derivative calculation.

Figure 6:
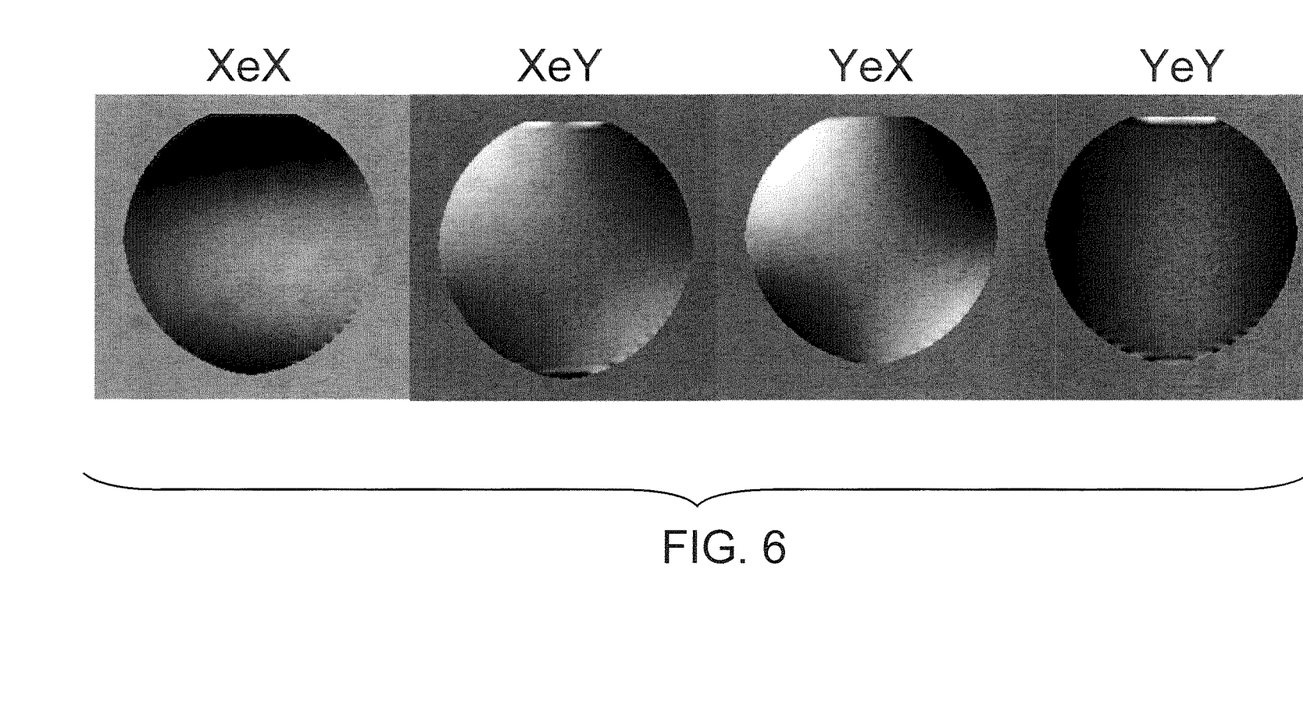
FIG. 6 is a depiction of eddy current field maps obtained by differentiating eddy current phase maps for both self-terms and cross-terms.

This produces spatially resolved eddy current maps for self-induced (XeX and YeY) eddy currents, as well as cross-induced eddy currents (XeY and YeX), as shown in FIG. 6. The example maps in FIG. 6 were acquired on a 3T system (with standard service calibrated eddy current parameters and gradient preemphasis hardware settings, so they are maps of only eddy current "residue"—which as can be seen is near zero eddy field near the isocenter, but with higher order eddy current residues for spherical harmonics):

XeX: $ay^2$ XeY: $2axy$ YeX: $2axy$ YeY: $ax^2$

Figure 7:
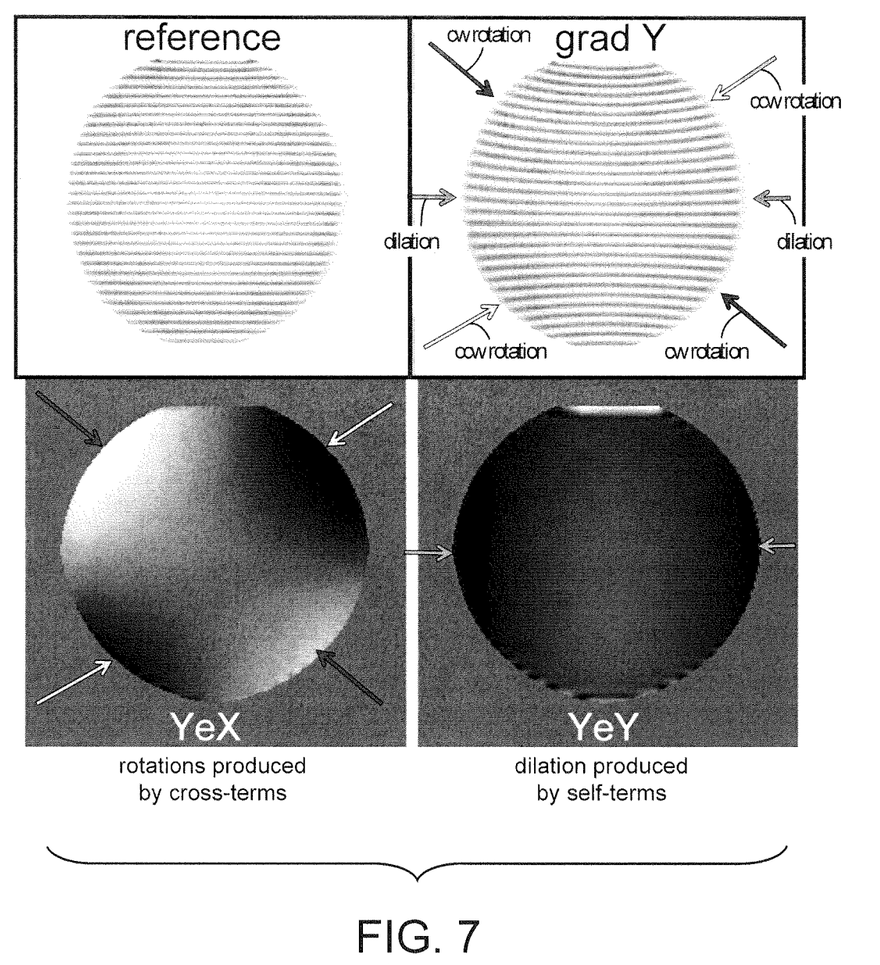
FIG. 7 depicts spatially resolved MR images of acquired spatially modulated phantom image data for a reference image as well as a Y-gradient stimulated eddy current case and also depicts corresponding eddy current field maps for self-terms and cross-terms illustrating how the spatially modulated grid lines are distorted by rotation and/or dilation as a function of stimulated eddy currents.

As shown in FIG. 7, YeX causes rotation (negative eddy stimulus amplitude causes counter-clockwise rotation, while positive eddy stimulus amplitude causes clockwise rotation of grid lines at the image edges).

YeY causes dilation (negative eddy current stimulus amplitude causes dilation of grid line spacing, while the center is unaffected). YeY being near zero amplitude near the isocenter is due to good eddy current pre-emphasis or other conventional HW eddy current compensation adjustments during MRI system calibration.

The above-described processing can be executed in 3D (e.g., by putting the grid tag gradient direction in the slice direction—but it is possibly best to execute multi-slice processes (e.g., measuring z-direction eddies with sagittal or coronal slices)).

The results of the eddy current maps are simply amplitudes. That is, the value of each pixel in each map is the amplitude of the vector that map represents. Multiple maps are created, one for each vector direction and source. In the example, there are XeX (sourcing X gradient channel causes eddy field in X physical direction), XeY (sourcing X gradient channel causes eddy field in Y physical direction) and vice versa for YeX and YeY.

There are known compensation methods using these maps as inputs. There is a clear distinction between the generation of these maps (the main subject of this application) and the application of these maps for correction.

The residential eddy current fields in the depicted example were measured on a wide-bore 3T clinical scanner. Conventional eddy current pre-emphasis (previously calibrated) was enabled; hence, only residual or remnant eddy currents were measured. A 30 cm sphere phantom object containing mineral oil was positioned at isocenter in the magnet bore. The eddy current mapping method described above was repeated to acquire three data sets: reference (stimulus off), X-axis stimulus on and Y-axis stimulus on. Both gradient stimuli were 30 mT/m trapezoidal lobes with zero delay between the end of the falling ramp of the gradient stimulus and the grid tag module. The gradient stimulus duration was 1 second to allow any eddy currents from the initial gradient rise to decay to make the experiment sensitive only to the falling ramp of the trapezoid. A two-shot asymmetric FSE readout was used with a TR of 3 seconds. Thus, a single slice was acquired in 6 seconds per data set, or 18 seconds for the whole experiment.

Although our method is sufficiently fast that it could be carried out on a human subject in a reasonable scan time, the scan data is preferably acquired using a homogeneous phantom object. The use of a phantom object has the key advantage of mitigating possible spatial misalignment of the image data in the stimulus and reference data sets caused by motion. Since the eddy fields are substantially independent of the object to be imaged, measurements data acquired on a phantom object are accurate for later use on a human subject. The phantom object should have sufficient coverage that it covers the volume of interest for the intended subsequent scans to be corrected. In anatomy such as brain, or brain and cervical spine, where the anatomy is placed inside a volume receive coil, then the eddy current scan may have a field of view (FOV) sufficient to cover the interior volume of the coil, i.e., 30 cm. For body scans and scans using geometrically open coil arrays, where some anatomy may extend beyond the nominal size of the receive array coils, it is sufficient to use a phantom object and FOV that covers the free bore space of a nominally cylindrical scanner magnet and coils system.

The stimulus, sensitization and detection elements of the eddy current measurement are effectively decoupled and hence can be optimized separately.

The stimulus amplitude and physical axis can be chosen freely. Time-dependency can be introduced by adjusting the delay between the stimulus and the gradient tag module and repeating the experiment.

Sensitivity to eddy fields can be tuned by modifying the inter-pulse duration ($\tau$) of the grid tag module. The $\tau$ period effectively acts to integrate the eddy-generated moment that exists during that inter-pulse duration. A shorter $\tau$ implies less sensitivity (where it takes large eddy fields to accumulate moment during $\tau$). A longer $\tau$ implies more sensitivity (where even small eddy fields can accumulate detectable moment during $\tau$). However, due to effective integration of the eddy field during the inter-pulse period, the accuracy of measuring the short-term eddy components (with time constants $<<\tau$), which may decay during this time, is compromised.

The readout sequence can be 2D or 3D of any type (field echo, spin echo, etc.) and can be optimized separately for the conventional trade-offs of resolution, SNR (signal-to-noise ratio) and time-efficiency. Ideally, the readout sequence should be insensitive to eddy current effects which may distort the image signal. For example, EPI would not be a good candidate as a readout sequence for our method because the image distortion in the stimulus/reference data sets may not be the same due to the presence/absence of the eddy-stimulating source.

FIG. 7 illustrates the effect of eddy current fields on spatial grid tag lines for a Y-axis stimulus. A reference magnitude image acquired with no ΔG eddy current stimulus is provided for comparison. The lower two images are eddy current field maps showing the magnitude of detected eddy currents in the X-axis and Y-axis direction caused by a −Gy stimulus. Self-terms (YeY) generate dilation (labeled arrows). Cross-terms (YeX) generate rotations, either clockwise (labeled arrows) or counter-clockwise (labeled arrows), depending on the polarity of the eddy current field. On the eddy map data, white=positive amplitude, black=negative amplitude, and gray=zero amplitude.

Technically, the X-squared and Y-squared, etc., terms are not really spherical harmonics; they may be regrouped, or they may correspond to a 2D "slice" at z=constant out of a proper function 3D function, or both.

Once 2D or 3D eddy current maps have been generated, it is potentially beneficial to reduce the data, and to fit a few model parameters. Eddy current maps are expected to be spatially smooth, in part because the quasi-static fields should be solutions to the Laplace's Equation, when imaging objects where internal current density is negligible. Thus it is reasonable to fit the field maps to generic polynomial terms, or specifically to spherical harmonic expansions. Or, if another set of functions is natural for some subsequent correction mechanism, the maps from our methods could be fitted for such a purpose. As a simple example, suppose that a few dynamic pulsed shim channels are available on a scanner hardware system. In such a case, it would be advantageous to fit the eddy current maps over some specified volume to the shim coil spatial field patterns. Other forms of fitting or data reduction or filtering can easily be envisioned.

Higher spatial order eddy currents are difficult to model and/or compensate—especially in EPI where body diffusion has different distortion at each slice and in FSE where off-center image FOV (field of view) (e.g., shoulder, wrist) has stronger signal loss.

Many published eddy current compensation methods exist including gradient digital pre-emphasis (e.g., pre-distortion gradient temporal waveform (typically using a hardware board)), moment pre-compensation (e.g., add extra gradient offsets or blips to compensate eddy fields), and receiver phase pre-compensation (e.g., correct zeroeth order (spatially invariant) phase offsets). Dynamically pulsed shim circuitry might be used for higher order eddy current compensation, on systems equipped with such circuitry. There are also known post-acquisition eddy current correction techniques including image-space based correction (e.g., affine registration to rewrap images) and k-space based corrections. All eddy current correction/compensation methods benefit from or require input from measurement and/or estimation of an eddy current field.

Some have attempted global eddy current measurements (e.g., by calculating global zeroeth and first order terms or by moving a small object in the MRI system gantry bore and reacquiring non-localized eddy current measurements). Spatially localized eddy current measurements have been attempted (e.g., via EPI readout, 1D phase navigator, 1D bar selection—sampling multiple bars and/or sampling multiple excited volumes around the bore). Volumetric eddy field mapping has involved measuring a phase map using 2D or 3D field-echo sequences or stimulated-echo based sequences or fitting a phase map to an eddy current model.

We here address the problem of eddy current field map measurement. Of course, the application of the eddy current field map for compensation/correction of diagnostic MRI images is the ultimate goal. Many existing eddy current field mapping methods are non-localized or 1D and cannot decipher spatial variations of the eddy field, but instead only solve zeroeth and first order terms at the isocenter. Existing volumetric eddy current mapping methods are also slow collecting only one phase encode view per TR. Such are often field-echo or FID-based, but the TR should be long enough to measure long time constant eddy current terms, and one does not want to repeat a gradient stimulus until its eddy has died.

Existing eddy current mapping techniques that measure image data phase directly are sensitive to phase error (susceptibility/B0 shim and coil-dependent receiver phase) and are affected by eddy current caused by the readout method itself (e.g., selection and readout gradients of measuring sequences produce small eddies).

Non-spatially resolved methods also cannot easily separate cross-terms from self-terms. Instead, they measure phase data at a single point (e.g., combining phase effects from all sources (XeX, XeY) and can only separate sources by fitting phase data to a model (and higher order terms can be difficult to model).

We now use a grid tag module in an eddy current mapping sequence. Eddy current moment is accumulated during an inter-pulse period of the grid tag module, which causes distortion of grid tag lines. An eddy field in the same direction as tag direction causes dilation or compression of tag line spacing, while an eddy field in an orthogonal direction (vis-á-vis the tag gradient) causes rotation of tag lines.

Thus, tagged data may be read out using any pulse sequence (e.g., including fast sequences: FFE, FSE, FASE, etc.) and then processed to create an eddy current phase map (e.g., using a window method in k-space) similar to the method of B1/B0 mapping used in Dannels, et al. (U.S. Patent Publication No. 2010/0239151), the entire content of which is hereby incorporated by reference). The phase map is then computed into an eddy field map by calculating self-terms and cross-terms individually.

The exemplary eddy mapping pulse sequence shown in FIG. 2 uses a long duration gradient stimulus A, which causes the eddy current to be measured as it terminates (i.e., transitions back to zero). An adjustable delay time B can, if desired, be inserted before a gradient tag module C1 is applied with inter-pulse time (τ). Gradient spoiler pulses (e.g., Gx, Gy, Gz) are preferably used at C2 before an image data readout sequence (FASE, FSE, FFE, etc.) is applied at D.

Figure 4:
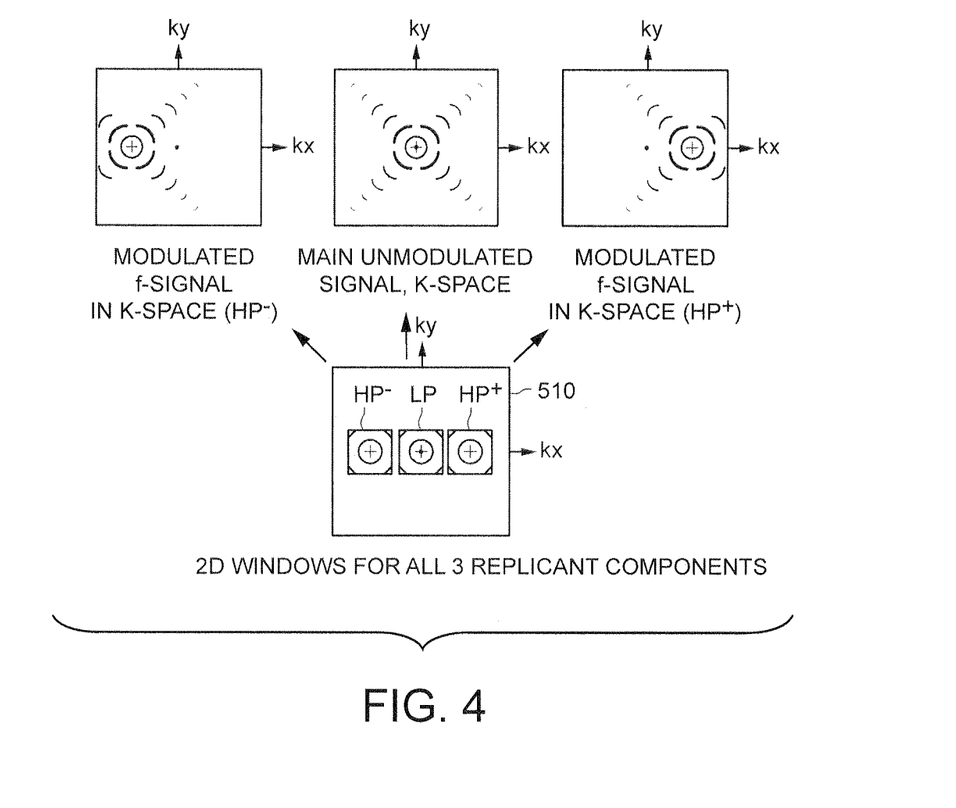
FIG. 4 is a schematic depiction of k-space MRI data acquired by the FIG. 2 sequence and a spatial frequency filtering process that gives rise to three replicant portions of the acquired k-space data including what are, in effect, upper and lower sidebands of the spatially modulated signal.

This creates reconstructed (2DFT) images in the spatial domain having warped grid tag lines as shown in FIG. 3. The image data of FIG. 3 can be processed using magnitude image pixel data as input. However, k-space based processing is actually preferred as depicted in FIG. 4—which is similar to the k-space replicant method of B1/B0 mapping method of Dannels, et al. (US 2010/0239151). Here, grid tag modulation produces replicant (e.g., harmonically related) copies of image data in k-space (e.g., at ±(grid spacing$^{-1}$) and center). Thus, separate left, right and center k-space replicants can be obtained using 2D low-pass windows (possibly with smoothed, e.g., Gaussian window edges). Each of these three replicants is then reconstructed into separate images having complex-valued pixels.

The processing method can be performed using either the k-space (window-based method) or by using an image space analysis method. Alternative processing may take place in the spatial domain by directly measuring dilation/compression/rotation of grid tag lines in spatial domain image data to calculate eddy fields. The option for magnitude processing is an advantage, but not a necessary feature.

The eddy stimulus can be repeated in different directions (X, Y or Z—or in arbitrary directions if composite Gx, Gy, Gz pulses are used for the eddy stimulus). Different amplitudes of ΔG can also be used (and it is not necessary to repeat an amplitude in any event). Only one stimulus image and one reference image are necessary, but more can be acquired for robustness of measurement. It is possible, but not necessary, to repeat the experiment with different spatial modulation orientations (i.e. modifying the direction of the spatial grid tag orientation).

The measured eddy current parameters can also be quantified. For example, amplitude can be quantified by dividing the eddy current amplitude by the stimulus ΔG to calculate eddy current amplitude expressed as a ratio of ΔG. The characteristic eddy current time constant can also be quantified (e.g., by repeat mapping for different stimulus delay periods (τ) and then fitting measured data from multiple τ to calculate time constant of exponential decay function at each pixel. If warranted, more than one time constant may be used to achieve a better fit to the temporal decay of all eddy currents.

The exemplary process of mapping eddy current fields is also fast. As previously mentioned, any readout sequence can be used (e.g., 1- or 2-shot FASE is a good choice for SNR and speed). Only a few seconds are needed to acquire each slice of an eddy map (which can be run in 2D or 3D). Magnitude-based processing is simple and robust, where use of phase differences avoids possible problems with phase wraps.

It is noted, that to directly measure a physical time constant of an eddy current, it may be useful to turn off some eddy current corrective measures. For example, if a spatially linear eddy current has a dominant or single time constant associated with it, and if it is corrected by gradient waveform preemphasis time constant which is set somewhat inaccurately, then there may be remnant or residual errors can be fit with varying degrees of success to combinations of both shorter and longer time constants. Therefore, the original time constant can be better fit when the potentially inaccurate preemphasis setting is turned off during the eddy current measurement acquisition.

One can detect both short and long time constant eddies. For example, the eddy-inducing gradient change can be placed immediately prior to the grid tag module in the mapping sequence (e.g., separated only by the duration of one RF pulse (~400 μs))—and any delay B is freely adjustable.

Figure 8:
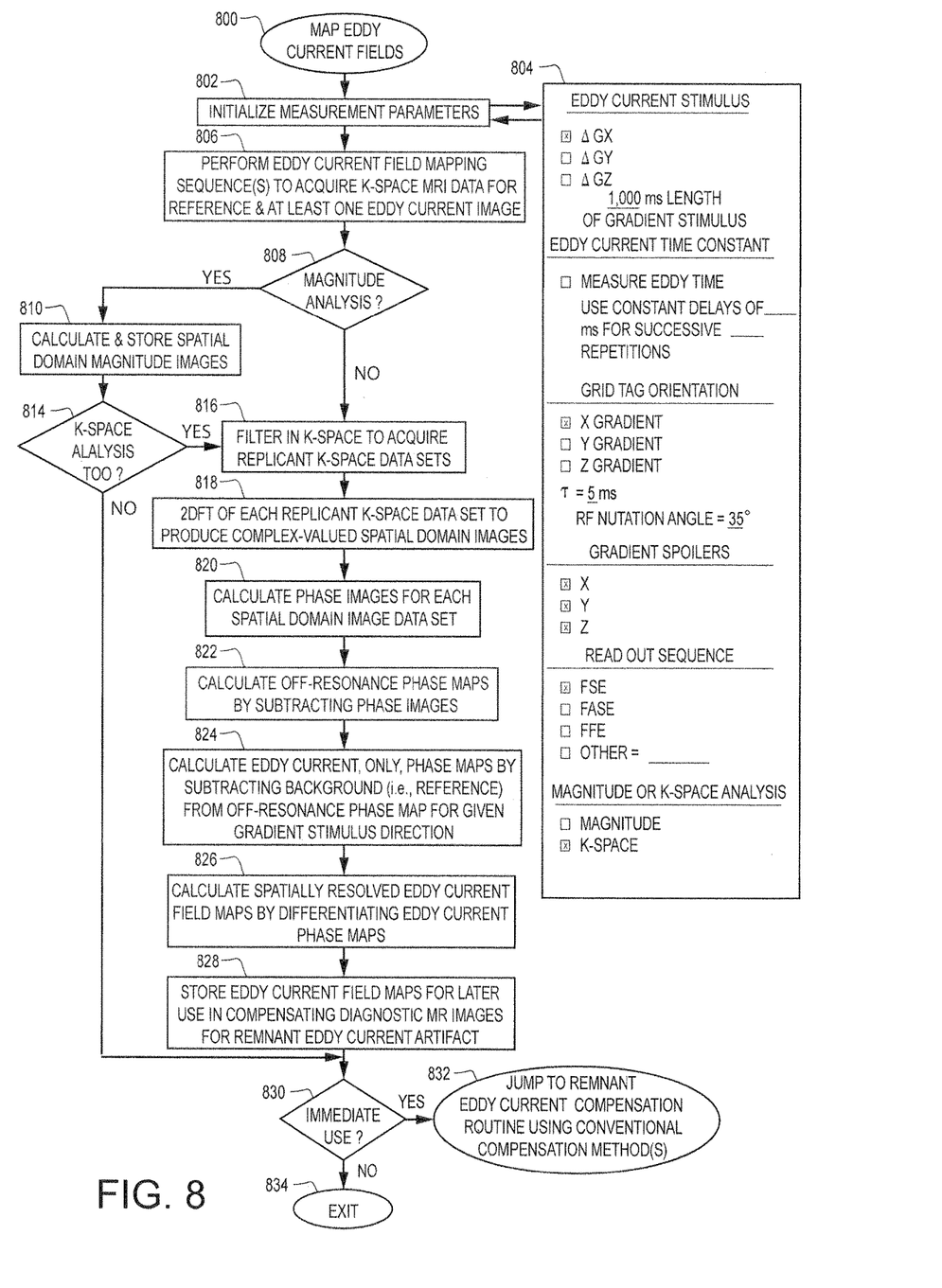
FIG. 8 is a schematic flow chart depiction of an executable computer program code structure for practicing an exemplary embodiment.

An exemplary executable program code structure as depicted at FIG. 8 may include a sub-routine for mapping eddy current fields entered at 800. At step 802, measurement parameters may be initialized in accordance with an appropriate graphical user interface (GUI) permitting user input of parameters such as those depicted at 804. For example, one or more eddy current stimuli may be chosen, and the length of the gradient stimulus has a default length of 1000 ms (i.e., 1 second), but might be changed for some reason if the user desires to do so. If a delay time B is desired or eddy current time constant measurements, then that can be indicated as shown. The grid tag gradient orientation is also selectable, as is the τ duration of the grid tag and the RF nutation angle. The use of one or more gradient spoilers is also a possible user-choice, as well as the particular kind of readout sequence for acquiring the MRI data in k-space. Finally, magnitude and/or k-space analyses may be selected.

At step 806, the required eddy current field mapping sequences are executed so as to acquire k-space data for a reference image and at least one eddy current image.

A test is made at 808 to see whether or not a magnitude analysis is requested. If so, then the usual spatial domain magnitude images are calculated and stored at 810. If magnitude analysis is chosen, then locations of tag line segments, are estimated, possibly along with angular orientations of those line segments. From these line segment estimations, tag displacements are used to compute eddy current residuals during the grid tag portion of the pulse sequence.

Then, at 814, a test is made to see whether a k-space analysis is desired. If not, then control is transferred to step 830 discussed below.

If no magnitude analysis is desired as tested at 808 or a k-space analysis is indicated at decision block 814, then control passes to block 816 where the k-space data is filtered so as to acquire/define replicant k-space data sets as noted above. Each of those replicant k-space data sets are then Fourier transformed at 818 to produce complex-valued spatial domain images corresponding to each replicant.

Subsequently, at step 820 in FIG. 8, phase images are calculated for each spatial domain image data set in the manner noted above and off-resonance phase maps are then calculated by subtracting certain phase images at block 822 before eddy current, only, phase maps are calculated at 824 by subtracting a reference/background phase map from an off-resonance phase map for a given gradient stimulation direction.

Finally, spatially resolved eddy current field maps are calculated at 826 by differentiating eddy current phase maps. The eddy current field maps are then stored at 828 for later use in compensating diagnostic MR images for remnant eddy current artifacts.

A test is then made at 830 to see whether or not compensation processes are desired for immediate implementation. If so, then a jump is made at 832 to conventional remnant eddy current compensation routines using conventional compensation methods as may be desired. If not, then an exit from this route is taken at 834.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for mapping eddy current fields in a magnetic resonance imaging (MRI) system, said method comprising:
using an MRI system to acquire and store MRI data from an object located in an imaging volume of the MRI system using an MRI data acquisition sequence which is preceded by a pre-sequence comprising (a) a gradient magnetic field transition which stimulates eddy current fields in the MRI system, and (b) a spatial modulation grid tag module which sensitizes a spatially resolved MR image of the acquired MRI data to the stimulated eddy current fields which existed during the spatial modulation grid tag module.

2. The method as in claim 1, further comprising:
processing said acquired MRI data to generate and store a spatial domain magnitude image of said object having grid lines superimposed thereon as a result of said spatial modulation grid tag, wherein said grid lines exhibit distortion caused by said stimulated eddy current fields not otherwise already compensated by said MRI system.

3. The method as in claim 2, wherein said distortion comprises local dilation or compression of the grid lines and/or local rotation of the grid lines.

4. The method as in claim 1, further comprising processing said acquired MRI data to generate a spatially resolved phase map of the stimulated eddy current fields, which phase map is used to generate and store a spatially resolved eddy current field map.

5. The method as in claim 4, wherein said MRI data is separately acquired for each of differently oriented gradient magnetic fields sufficient to generate MRI field map data representing self-terms and cross-terms of stimulated eddy current fields, said self-terms being eddy current fields stimulated in the same direction as the stimulating gradient and said cross-terms being eddy current fields stimulated in a different direction from that of the stimulating gradient.

6. The method as in claim 4, wherein said phase map is generated using frequency-filtered replicants of acquired MRI k-space data.

7. The method as in claim 6, wherein said replicants comprise a central low-pass filtered portion of acquired k-space data, a left-side high-pass filtered portion of acquired k-space data and a right-side high-pass filtered portion of acquired k-space data, said method further comprising:
Fourier-transforming two or more replicant portions of k-space to produce respectively corresponding complex-valued spatial domain images;
converting each complex-valued replicant spatial domain image to a corresponding phase image;
generating an off-resonance phase map by subtracting at least two of said phase images from each other;
calculating an eddy current, only, phase map wherein background reference phase is cancelled by subtraction of another off-resonance phase map acquired with eddy current stimulus of a different amplitude or polarity; and
differentiating eddy current phase map images to produce a spatially resolved eddy current field map.

8. The method as in claim 1, wherein:
said pre-sequence is configured to include at least one time delay between the gradient magnetic field transition and the spatial modulation grid tag module; and,
said MRI data is acquired plural times, at least once for each of at least two different time delays, possibly including a zero time delay, between the gradient magnetic field transition and the spatial modulation grid tag module, thereby producing time-dependent measurements of the stimulated eddy current fields; and
fitting said time-dependent measurements to an exponential decay curve thereby deriving at least one decay time-constant associated with said stimulated eddy current fields.

9. The method as in claim 1, wherein said MRI data acquisition sequence is one of the following: (a) FSE (fast spin echo), (b) FASE (fast asymmetric spin echo), and (c) FFE (fast field echo).

10. The method as in claim 1, wherein said spatial modulation grid tag module comprises:
at least two non-selective RF nutation pulses with an intervening gradient magnetic field tagging pulse.

11. An MRI system comprising:
an MRI scanner configured to acquire and store MRI data from an object located in an imaging volume of the MRI system using an MRI data acquisition sequence which is preceded by a pre-sequence comprising (a) a gradient magnetic field transition which stimulates eddy current fields in the MRI system, and (b) a spatial modulation grid tag module which sensitizes a spatially resolved MR image of the acquired MRI data to the stimulated eddy current fields which existed during the spatial modulation grid tag module.

12. The MRI system as in claim 11, wherein said MRI system comprises at least one data processor configured to process said acquired MRI data to generate and store a spatial domain magnitude image of said object having grid lines superimposed thereon as a result of said spatial modulation grid tag, wherein said grid lines exhibit distortion caused by said stimulated eddy current fields not otherwise already compensated by said MRI system.

13. The MRI system as in claim 12, wherein said distortion comprises local dilation or compression of the grid lines and/or local rotation of the grid lines.

14. The MRI system as in claim 11, wherein said MRI system comprises at least one data processor configured to process said acquired MRI data to generate a spatially resolved phase map of the stimulated eddy current fields, which phase map is used to generate and store a spatially resolved eddy current field map.

15. The MRI system as in claim 14, wherein said MRI scanner is configured to separately acquire MRI data for each of differently oriented gradient magnetic fields sufficient to generate MRI field map data representing self-terms and cross-terms of stimulated eddy current fields, said self-terms being eddy current fields stimulated in the same direction as the stimulating gradient and said cross-terms being eddy current fields stimulated in a different direction from that of the stimulating gradient.

16. The MRI system as in claim 14, wherein said phase map is generated using frequency-filtered replicants of acquired MRI k-space data.

17. The MRI system as in claim 16, wherein said replicants comprise a central low-pass filtered portion of acquired k-space data, a left-side high-pass filtered portion of acquired k-space data and a right-side high-pass filtered portion of acquired k-space data, said at least one data processor being configured to:
Fourier-transforming two or more replicant portions of k-space to produce respectively corresponding complex-valued spatial domain images;
convert each complex-valued replicant spatial domain image to a corresponding phase image;
generate an off-resonance phase map by subtracting at least two of said phase images from each other;
calculate an eddy current, only, phase map wherein background reference phase is cancelled by subtraction of another off-resonance phase map acquired with eddy current stimulus of a different amplitude or polarity; and
differentiate eddy current phase map images to produce a spatially resolved eddy current field map.

18. The MRI system as in claim 11, wherein said MRI scanner is configured to include at least one time delay between the gradient magnetic field transition and the spatial modulation grid tag module; and,
    acquire said MRI data plural times, at least once for each of at least two different time delays, possibly including a zero time delay, between the gradient magnetic field transition and the spatial modulation grid tag module, thereby producing time-dependent measurements of the stimulated eddy current fields; and
    fit said time-dependent measurements to an exponential decay curve thereby deriving at least one decay time-constant associated with said stimulated eddy current fields.

19. The MRI system as in claim 11, wherein said MRI data acquisition sequence is one of the following: (a) FSE (fast spin echo), (b) FASE (fast asymmetric spin echo), and (c) FFE (fast field echo).

20. The MRI system as in claim 11, wherein said spatial modulation grid tag module comprises:
    at least two non--selective RF nutation pulses with an intervening gradient magnetic field tagging pulse.

\* \* \* \* \*